US011769724B2

United States Patent
Chen et al.

(10) Patent No.: US 11,769,724 B2
(45) Date of Patent: *Sep. 26, 2023

(54) PACKAGE HAVING DIFFERENT METAL DENSITIES IN DIFFERENT REGIONS AND MANUFACTURING METHOD THEREOF

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW); Sen-Bor Jan, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/684,431

(22) Filed: Mar. 2, 2022

(65) Prior Publication Data

US 2022/0246524 A1 Aug. 4, 2022

Related U.S. Application Data

(63) Continuation of application No. 16/929,118, filed on Jul. 15, 2020, now Pat. No. 11,309,243.

(60) Provisional application No. 62/892,558, filed on Aug. 28, 2019.

(51) Int. Cl.
  *H01L 23/522* (2006.01)
  *H01L 23/00* (2006.01)
  *H01L 23/31* (2006.01)
  *H01L 21/56* (2006.01)

(52) U.S. Cl.
  CPC .......... *H01L 23/5227* (2013.01); *H01L 21/56* (2013.01); *H01L 23/3107* (2013.01); *H01L 24/03* (2013.01); *H01L 24/05* (2013.01); *H01L 24/20* (2013.01); *H01L 2224/03011* (2013.01)

(58) Field of Classification Search
  CPC ..... H01L 23/5227; H01L 24/05; H01L 24/03; H01L 23/3107; H01L 21/56; H01L 24/20; H01L 2224/03011; H01L 25/50; H01L 2225/06568; H01L 2225/06527; H01L 2225/06541; H01L 25/0657; H01L 25/16; H01L 23/3157
  See application file for complete search history.

(56) References Cited

U.S. PATENT DOCUMENTS

| | | | |
|---|---|---|---|
| 9,627,365 B1 * | 4/2017 | Yu | H01L 27/2481 |
| 9,807,882 B1 * | 10/2017 | Berdy | H03H 7/0115 |
| 10,217,726 B1 * | 2/2019 | Nakano | H01L 24/83 |
| 10,431,565 B1 * | 10/2019 | Kim | H01L 24/94 |

(Continued)

*Primary Examiner* — Mamadou L Diallo
(74) *Attorney, Agent, or Firm* — JCIPRNET

(57) ABSTRACT

A package has a first region and a second region surrounded by the first region. The package includes a first die, a second die, an encapsulant, and an inductor. The first die extends from the first region to the second region. The second die is bonded to the first die and is located within a span of the first die. The encapsulant is aside the second die. At least a portion of the encapsulant is located in the second region. The inductor is located in the second region. The inductor laterally has an offset from the second die. A metal density in the first region is greater than a metal density in the second region.

20 Claims, 15 Drawing Sheets

(56) References Cited

U.S. PATENT DOCUMENTS

| | | | | |
|---|---|---|---|---|
| 2012/0175732 | A1* | 7/2012 | Lin | H01L 25/16 |
| | | | | 438/109 |
| 2013/0161833 | A1* | 6/2013 | Pendse | H01L 23/5389 |
| | | | | 257/777 |
| 2015/0022985 | A1* | 1/2015 | Na | H05K 1/183 |
| | | | | 361/764 |
| 2017/0221863 | A1* | 8/2017 | Yeh | H01L 24/20 |
| 2017/0373025 | A1* | 12/2017 | Kim | H01L 23/5383 |
| 2018/0005988 | A1* | 1/2018 | Deligianni | H01L 27/092 |
| 2018/0277516 | A1* | 9/2018 | Kume | H01L 23/481 |
| 2019/0019756 | A1* | 1/2019 | Yu | H01L 24/20 |
| 2019/0096830 | A1* | 3/2019 | Wei | H01L 24/92 |
| 2019/0229092 | A1* | 7/2019 | Ding | H01L 24/13 |
| 2020/0091094 | A1* | 3/2020 | Yun | H01L 23/5227 |
| 2020/0098621 | A1* | 3/2020 | Bharath | H01L 23/13 |
| 2020/0168574 | A1* | 5/2020 | Huang | H01L 24/16 |
| 2020/0235082 | A1* | 7/2020 | Eid | H01L 21/4882 |
| 2020/0286660 | A1* | 9/2020 | Kamgaing | H01L 24/16 |
| 2020/0357767 | A1* | 11/2020 | Sato | H01L 24/02 |
| 2020/0402934 | A1* | 12/2020 | Kim | H01L 23/645 |
| 2020/0411461 | A1* | 12/2020 | Lee | H01L 23/49827 |
| 2021/0066191 | A1* | 3/2021 | Chen | H01L 23/5226 |

* cited by examiner

PACKAGE HAVING DIFFERENT METAL DENSITIES IN DIFFERENT REGIONS AND MANUFACTURING METHOD THEREOF

CROSS-REFERENCE TO RELATED APPLICATION

This is a continuation application of and claims the priority benefit of U.S. application Ser. No. 16/929,118, filed on Jul. 15, 2020, now allowed. The prior U.S. application Ser. No. 16/929,118 claims the priority benefit of U.S. provisional application Ser. No. 62/892,558, filed on Aug. 28, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
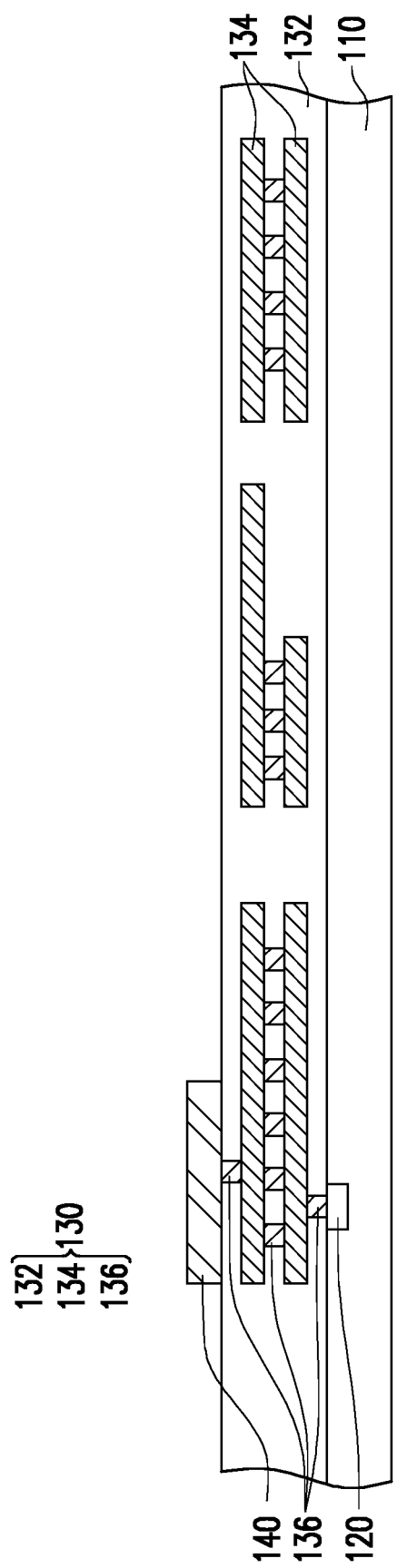
FIG. 1A to FIG. 1K are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic cross-sectional views illustrating a manufacturing process of a package 10 in accordance with some embodiments of the disclosure. Referring to FIG. 1A, a semiconductor substrate 110 is provided. The semiconductor substrate 110 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The semiconductor substrate 110 may be a bulk silicon substrate, a silicon-on-insulator (SOI) substrate, or a germanium-on-insulator (GOI) substrate. In some embodiments, the semiconductor substrate 110 has a device 120 formed therein. The device 120 may include active components (e.g., transistors or the like) and/or passive components (e.g., resistors, capacitors, inductors, or the like). For simplicity, one device 120 is shown in FIG. 1A. However, it should be understood that more than one devices may be formed in the semiconductor substrate 110.

As illustrated in FIG. 1A, an interconnection structure 130 is formed on the semiconductor substrate 110. In some embodiments, the interconnection structure 130 includes a dielectric layer 132, a plurality of conductive patterns 134, and a plurality of conductive vias 136. For simplicity, the dielectric layer 132 is illustrated as a single dielectric layer and the conductive patterns 134 are illustrated as embedded in the dielectric layer 132. Nevertheless, from the perspective of the manufacturing process, the dielectric layer 132 is constituted by at least two dielectric layers, and the conductive patterns 134 are sandwiched between two adjacent dielectric layers. In some embodiments, the conductive patterns 134 located at different level heights are connected to each other through the conductive vias 136. In other words, the conductive patterns 134 are electrically connected to each other through the conductive vias 136. In some embodiments, the bottommost conductive via 136 is connected to the device 120 embedded in the semiconductor substrate 110. In other words, the bottommost conductive via 136 establishes electrical connection between the device 120 and the conductive patterns 134 of the interconnection structure 130. In some embodiments, the bottommost conductive via 136 may be referred to as "contact structure" of the device 120.

In some embodiments, the material of the dielectric layer 132 includes polyimide, epoxy resin, acrylic resin, phenol resin, benzocyclobutene (BCB), polybenzooxazole (PBO), or any other suitable polymer-based dielectric material. The dielectric layer 132, for example, may be formed by suitable fabrication techniques such as spin-on coating, chemical vapor deposition (CVD), plasma-enhanced chemical vapor deposition (PECVD), or the like. In some embodiments, a material of the conductive patterns 134 and the conductive vias 136 include aluminum, titanium, copper, nickel, tungsten, or alloys thereof. The conductive patterns 134 and the conductive vias 136 may be formed by, for example, electroplating, deposition, and/or photolithography and etching. In some embodiments, the conductive patterns 134 and the underlying conductive vias 136 may be formed simultaneously. It should be noted that the number of the dielectric layers 132, the number of the conductive patterns 134, and the number of the conductive vias 136 illustrated in FIG. 1A are merely for illustrative purposes, and the disclosure is not limited thereto. In some alternative embodiments, fewer or more layers of the dielectric layers 132, the conductive patterns 134, or the conductive vias 136 may be formed depending on the circuit design.

As illustrated in FIG. 1A, a conductive pad 140 is formed over the interconnection structure 130. In some embodiments, the conductive pad 140 is electrically connected to the conductive patterns 134 of the interconnection structure 130 through the topmost conductive via 136. In some embodiments, the conductive pad 140 is used to establish electrical connection with other components (not shown) or dies (not shown) subsequently formed or provided. In some alternative embodiments, the conductive pad 140 may be a test pad used to probe the subsequently formed wafer substrate WS (shown in FIG. 1C) in which the conductive pad 140 is included. In some embodiments, the conductive pad 140 may be an aluminum pad, a copper pad, or other suitable metal pad. For simplicity, one conductive pad 140 is shown in FIG. 1A. However, it should be understood that more than one conductive pads may be formed over the interconnection structure 130. The number and shape of the conductive pad 140 may be selected based on demand.

Figure 1B:
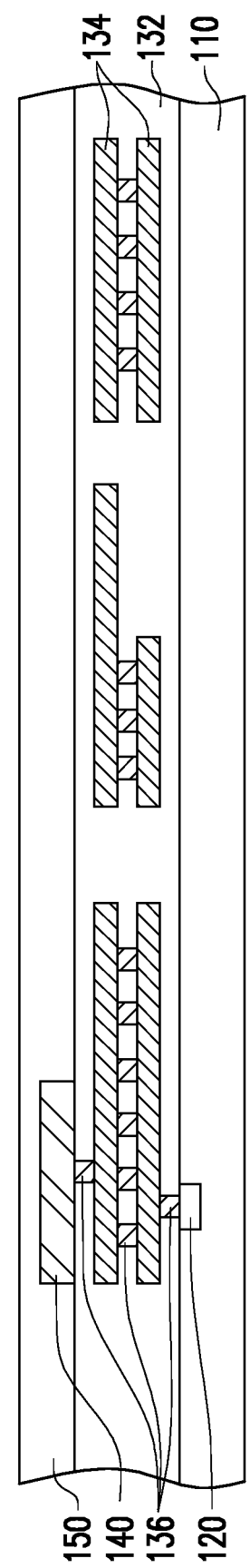

Referring to FIG. 1B, a passivation layer 150 is formed over the interconnection structure 130 and the conductive pad 140. In some embodiments, a material of the passivation layer 150 includes oxides, such as silicon oxide or the like. Alternatively, the passivation layer 150 may include polyimide, epoxy resin, acrylic resin, phenol resin, BCB, PBO, or any other suitable polymer-based dielectric material. The passivation layer 150, for example, may be formed by suitable fabrication techniques, such as spin-on coating, CVD, PECVD, or the like.

Figure 1C:
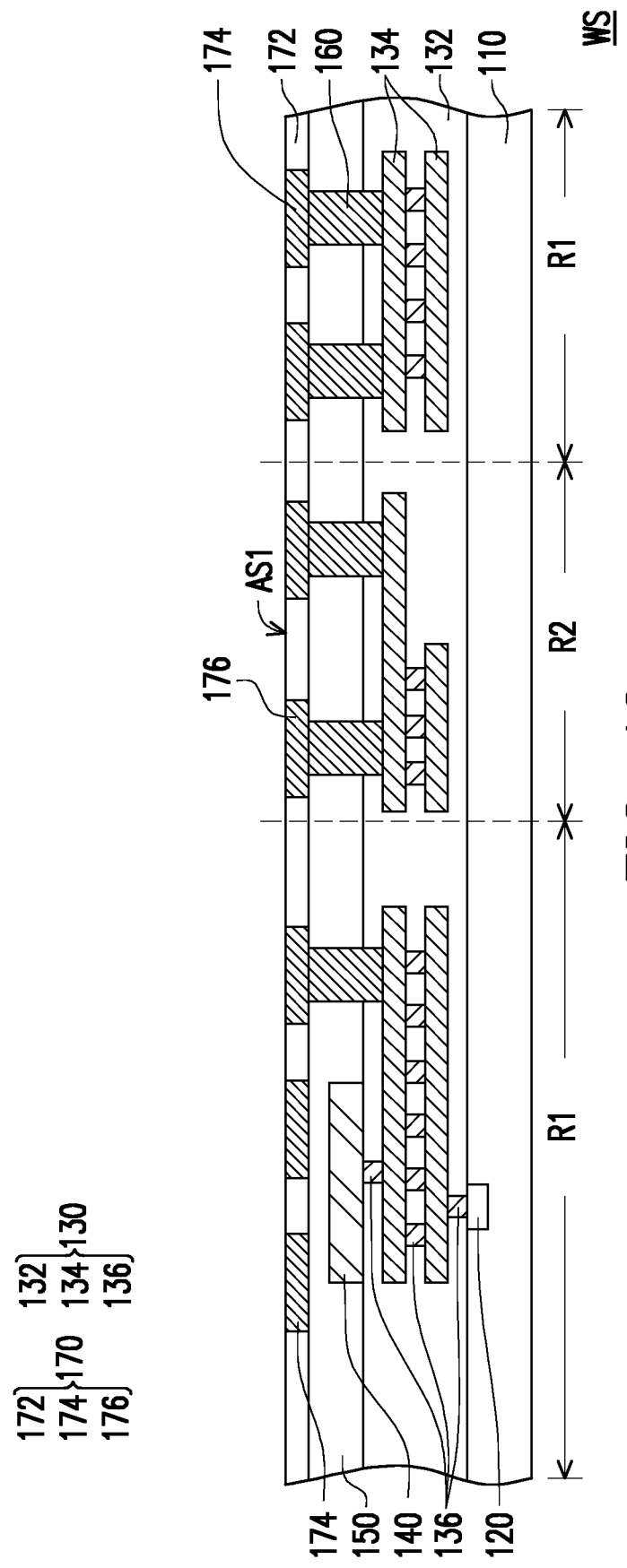

Referring to FIG. 1C, a plurality of bonding vias 160 and a bonding layer 170 are formed to obtain a wafer substrate WS. In some embodiments, the wafer substrate WS has a first region R1 and second regions R2. In some embodiments, the first region R1 surrounds the second regions R2. As illustrated in FIG. 1C, the bonding vias 160 are formed to penetrate through the passivation layer 150 and at least part of the dielectric layer 132 of the interconnection structure 130 to establish electrical connection with the conductive patterns 134 of the interconnection structures 130. The bonding layer 170 is formed over the passivation layer 150 and the bonding vias 160. In some embodiments, the bonding layer 170 includes a dielectric layer 172, a plurality of bonding pads 174, and a plurality of dummy bonding pads 176. In some embodiments, the bonding pads 174 are located in the first region R1 while the dummy bonding pads 176 are located in the second regions R2. In some embodiments, the bonding pads 174 and the dummy bonding pads 176 are embedded in the dielectric layer 172. In some embodiments, the bonding pads 174 and the dummy bonding pads 176 of the bonding layer 170 are electrically connected to the bonding vias 160. That is, the bonding vias 160 electrically connect the interconnection structure 130 with the bonding pads 174 and the dummy bonding pads 176. However, the disclosure is not limited thereto. In some alternative embodiments, the bonding vias 160 directly underneath the dummy bonding pads 176 may be omitted. That is, the dummy bonding pads 176 are not connected to the interconnection structure 130 and are electrically floating.

In some embodiments, the bonding vias 160, the bonding pads 174, and the dummy bonding pads 176 may be formed via a dual damascene process. For example, the dielectric layer 172 is first formed on the passivation layer 150. In some embodiments, a material of the dielectric layer 172 includes oxides, such as silicon oxide or the like. Alternatively, the dielectric layer 172 may include polyimide, epoxy resin, acrylic resin, phenol resin, BCB, PBO, or any other suitable polymer-based dielectric material. The dielectric layer 172, for example, may be formed by suitable fabrication techniques, such as spin-on coating, CVD, PECVD, or the like. Subsequently, trenches and via holes (not shown) are formed in the dielectric layer 172 and the passivation layer 150 by removing portions of theses layers. In some embodiments, a width of the trench is greater than a width of the via hole. Thereafter, a conductive material (not shown) is filled into the via holes to form the bonding vias 160. Meanwhile, the conductive material (not shown) also fills into the trenches to from the bonding pads 174 and the dummy bonding pads 176. That is, the bonding vias 160, the bonding pads 174, and the dummy bonding pads 176 are formed by simultaneously filling via holes and overlying trenches (not shown). However, the disclosure is not limited thereto. In some alternative embodiments, the bonding vias 160 may be formed before the dielectric layer 172, the bonding pads 174, and the dummy bonding pads 176. In some embodiments, a width of each bonding pad 174 may be greater than a width of each underlying bonding via 160. Similarly, a width of each dummy bonding pad 176 may be greater than a width of each underlying bonding via 160. In some embodiments, the bonding vias 160, the bonding pads 174, and the dummy bonding pads 176 include the same material. For example, the bonding vias 160, the bonding pads 174, and the dummy bonding pads 176 may be made of aluminum, titanium, copper, nickel, tungsten, or alloys thereof. In some embodiments, the bonding pads 174 and the dummy bonding pads 176 may be simultaneously formed.

In some embodiments, a top surface of the dielectric layer 172, top surfaces of the bonding pads 174, and top surfaces of the dummy bonding pads 176 may be collectively referred to as an active surface AS1 of the wafer substrate WS. As shown in FIG. 1C, the top surface of the dielectric layer 172, the top surfaces of the bonding pads 174, and the top surfaces of the dummy bonding pads 176 are substantially located at the same level height to provide an appropriate active surface AS1 for hybrid bonding.

Although not illustrated, in some embodiments, some of the bonding vias 160 may be disposed directly above the conductive pad 140 to establish electrical connection between the conductive pad 140 and other elements (for example, the bonding pads 174 directly above the conductive pad 140). That is, in some embodiments, some of the conductive pads 140 are electrically floating while some of the conductive pads 140 are able to transmit signal.

In some embodiments, the arrangement of the bonding pads 174 located in the first region R1 may be different from the arrangement of the dummy bonding pads 176 located in the second regions R2. The configurations of the bonding pads 174 and the dummy bonding pads 176 will be described below in conjunction with FIG. 2A.

Figure 2A:
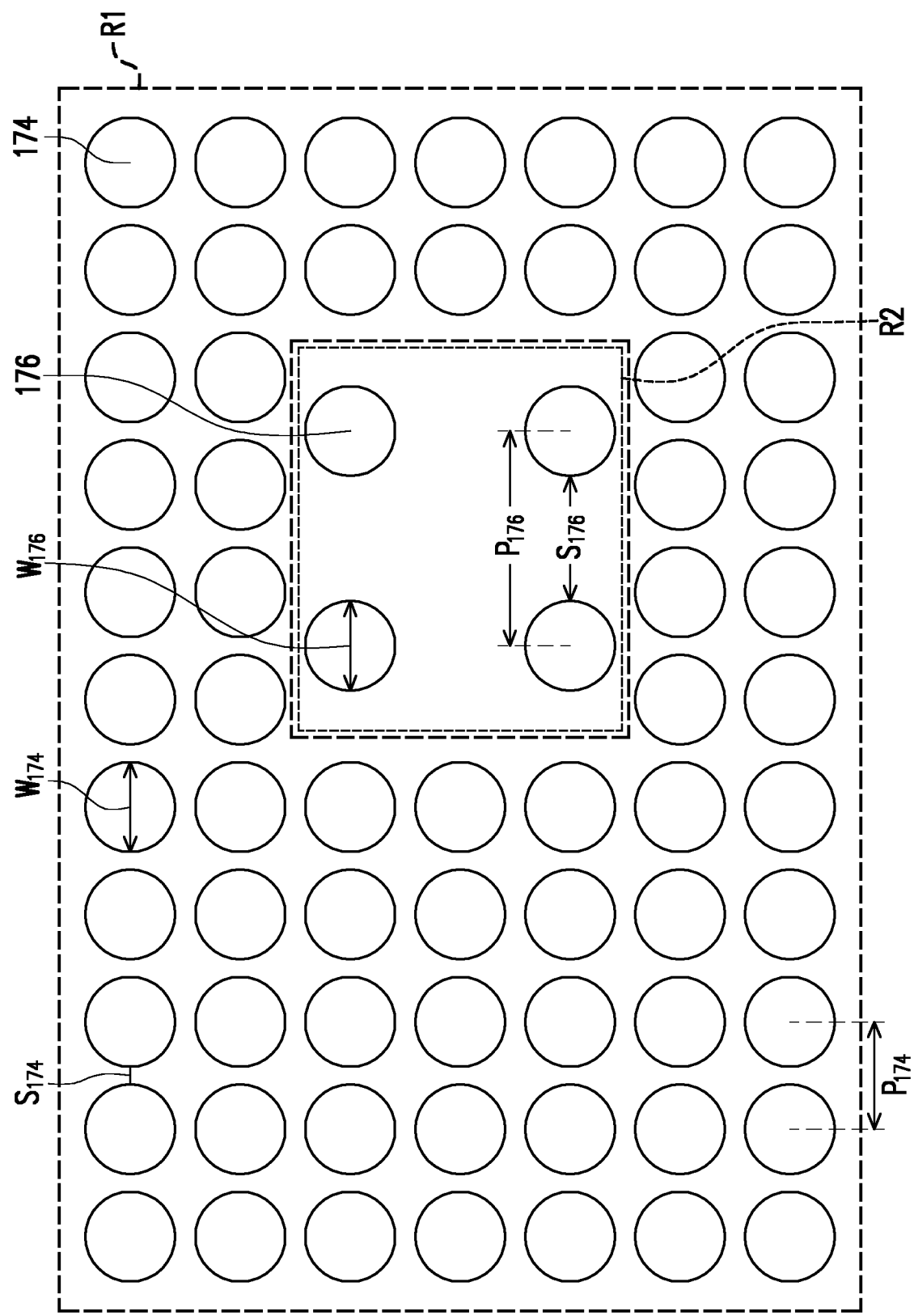
FIG. 2A is a schematic top view of FIG. 1C.

FIG. 2A is a schematic top view of FIG. 1C. Referring to FIG. 1C and FIG. 2A, the second region R2 is enclosed by the first region R1. However, the disclosure is not limited thereto. In some alternatively embodiments, the second region R2 may be next to the first region R1. That is, the first region R1 and the second region R2 may be arranged in a side-by-side manner. As illustrated in FIG. 1C and FIG. 2A, a metal density in the first region R1 is greater than a metal density in the second region R2. Throughout the disclosure, the metal density is referred to as a volume of metal material within a unit volume. For example, within the same volume, the amount of metal material in the first region R1 is greater than the amount of metal material in the second region R2. Moreover, as illustrated in FIG. 2A, a pattern density of the bonding pads 174 is greater than a pattern density of the dummy bonding pads 176. Throughout the disclosure, the pattern density is referred to as a percentage of a unit area occupied by metal patterns from a top view. For example, within the same area, the number of the bonding pads 174 is greater than the number of the dummy bonding pads 176. In some embodiments, a ratio of the pattern density of the dummy bonding pads 176 to the pattern density of the bonding pads 174 ranges from 1:2.7 to 1:27. For example, the pattern density of the bonding pads 174 in the first region R1 may be approximately 27% while the pattern density of the dummy bonding pads 176 in the second region R2 may be approximately 1% to approximately 10%.

As illustrated in FIG. 2A, a width $W_{174}$ of each bonding pad 174 is substantially the same as a width $W_{176}$ of each dummy bonding pads 176. In some embodiments, the width $W_{174}$ of the bonding pads 174 may range between 2.5 μm and 3.5 μm. Similarly, the width $W_{176}$ of the dummy bonding pads 176 may also range between 2.5 μm and 3.5 μm. On the other hand, a pitch $P_{174}$ between two adjacent bonding pads 174 is different from a pitch $P_{176}$ between two adjacent dummy bonding pads 176. Similarly, a spacing $S_{174}$ between two adjacent bonding pads 174 is also different from a spacing $S_{176}$ between two adjacent dummy bonding pads 176. Throughout the disclosure, the pitch $P_{174}$ between two adjacent bonding pads 174 is referred to as a minimum distance between two centers of the adjacent bonding pads 174, and the pitch $P_{176}$ between two adjacent dummy bonding pads 176 is referred to as a minimum distance between two centers of the adjacent dummy bonding pads 176. On the other hand, throughout the disclosure, the spacing $S_{174}$ between two adjacent bonding pads 174 is referred to as a minimum distance between edges of the adjacent bonding pads 174, and the spacing $S_{176}$ between two adjacent dummy bonding pads 176 is referred to as a minimum distance between edges of the adjacent dummy bonding pads 176. In some embodiments, the pitch $P_{174}$ between two adjacent bonding pads 174 ranges between 6 μm and 9 μm. On the other hand, the pitch $P_{176}$ between two adjacent dummy bonding pads 176 is greater than 10 μm. For example, the pitch $P_{176}$ between two adjacent dummy bonding pads 176 ranges between 11 μm and 30 μm. That is, the pitch $P_{176}$ between two adjacent dummy bonding pads 176 is greater the pitch $P_{174}$ between two adjacent bonding pads 174. In some embodiments, the spacing $S_{174}$ between two adjacent bonding pads 174 ranges between 2.5 μm and 6.5 μm. On the other hand, the spacing $S_{176}$ between two adjacent dummy bonding pads 176 ranges between 8.5 μm and 27.5 μm. That is, the spacing $S_{174}$ between two adjacent bonding pads 174 is smaller than the spacing $S_{176}$ between two adjacent dummy bonding pads 176. As illustrated in FIG. 2A, by varying the pitch and the spacing between two adjacent patterns, the difference in pattern densities in the first region R1 and the second region R2 may be achieved. However, the disclosure is not limited thereto. In some alternative embodiments, other configurations of the bonding pads 174 and the dummy bonding pads 176 may be adopted to achieve the variation in pattern densities of different regions. These configurations will be described below in conjunction with FIG. 2B to FIG. 2C.

Figure 2B:
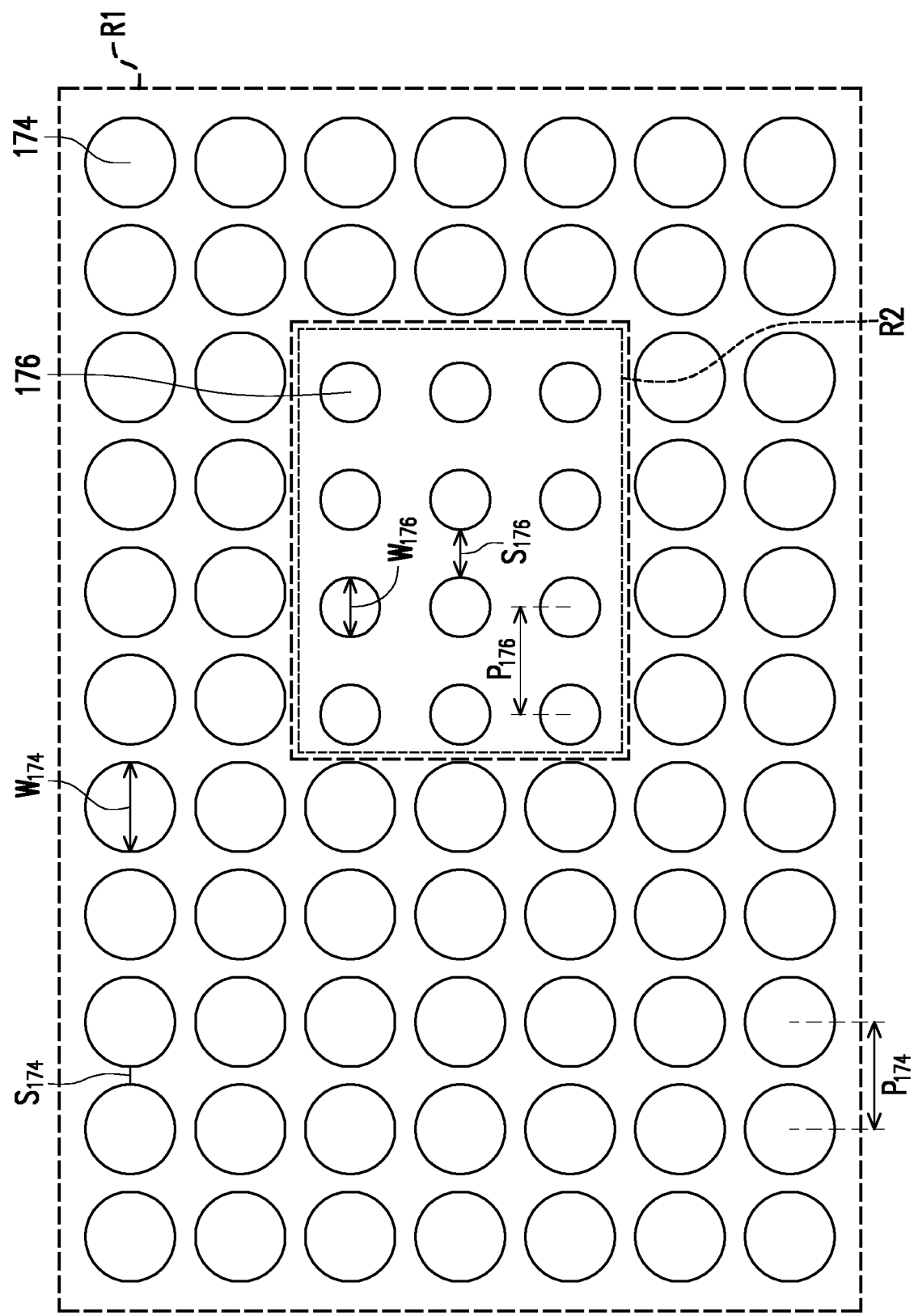
FIG. 2B and FIG. 2C are respectively schematic top views of FIG. 1C in accordance with some alternative embodiments of the disclosure.
Figure 2C:
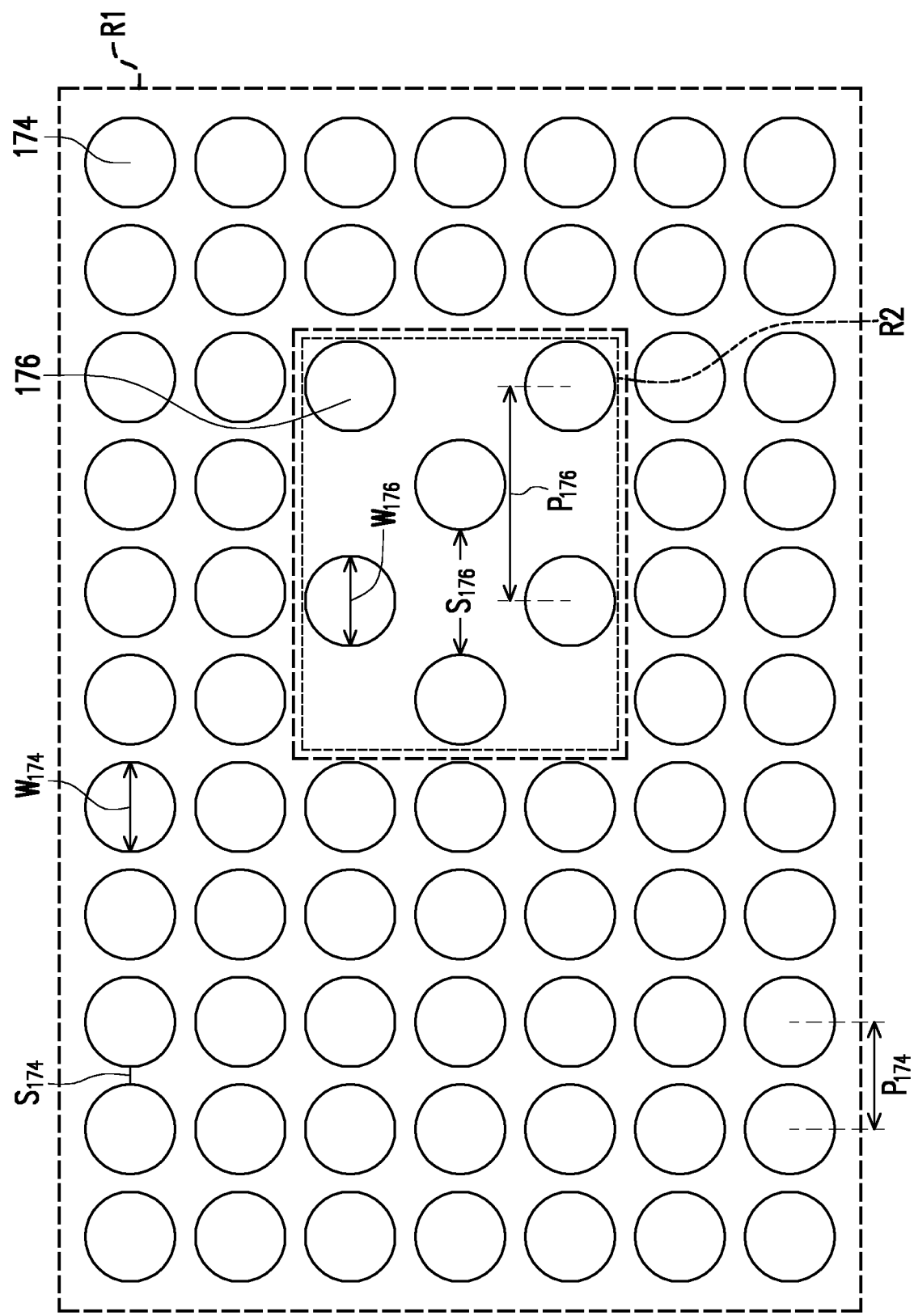

FIG. 2B and FIG. 2C are respectively schematic top views of FIG. 1C in accordance with some alternative embodiments of the disclosure. Referring to FIG. 2B, the second region R2 is enclosed by the first region R1. However, the disclosure is not limited thereto. In some alternatively embodiments, the second region R2 may be next to the first region R1. That is, the first region R1 and the second region R2 may be arranged in a side-by-side manner. As illustrated in FIG. 1C and FIG. 2B, a metal density in the first region R1 is greater than a metal density in the second region R2. Moreover, as illustrated in FIG. 2B, a pattern density of the bonding pads 174 is greater than a pattern density of the dummy bonding pads 176. In some embodiments, a ratio of the pattern density of the dummy bonding pads 176 to the pattern density of the bonding pads 174 ranges from 1:2.7 to 1:27. For example, the pattern density of the bonding pads 174 in the first region R1 may be approximately 27% while the pattern density of the dummy bonding pads 176 in the second region R2 may be approximately 1% to approximately 10%.

As illustrated in FIG. 2B, a width $W_{174}$ of each bonding pad 174 is greater than a width $W_{176}$ of each dummy bonding pad 176. In some embodiments, the width $W_{174}$ of the bonding pads 174 may range between 2.5 μm and 3.5 μm. On the other hand, the width $W_{176}$ of the dummy bonding pads 176 may range between 1 μm and 2.3 μm. In some embodiments, a pitch $P_{174}$ between two adjacent bonding pads 174 is substantially the same as a pitch $P_{176}$ between two adjacent dummy bonding pads 176. For example, the pitch $P_{174}$ between two adjacent bonding pads 174 ranges between 6 μm and 9 μm. Similarly, the pitch $P_{176}$ between two adjacent dummy bonding pads 176 also ranges between 6 μm and 9 μm. In some embodiments, a spacing $S_{174}$ between two adjacent bonding pads 174 is smaller than a spacing 5176 between two adjacent dummy bonding pads 176. For example, the spacing $P_{174}$ between two adjacent bonding pads 174 ranges between 2.5 μm and 6.5 μm. On the other hand, the spacing $S_{176}$ between two adjacent dummy bonding pads 176 ranges between 6.7 μm and 8 μm. As illustrated in FIG. 2B, by varying the width of the patterns and the spacing between two adjacent patterns, the difference in pattern densities in the first region R1 and the second region R2 may be achieved.

Referring to FIG. 2C, the second region R2 is enclosed by the first region R1. However, the disclosure is not limited thereto. In some alternatively embodiments, the second region R2 may be next to the first region R1. That is, the first region R1 and the second region R2 may be arranged in a side-by-side manner. As illustrated in FIG. 1C and FIG. 2C, a metal density in the first region R1 is greater than a metal density in the second region R2. Moreover, as illustrated in FIG. 2C, a pattern density of the bonding pads 174 is greater than a pattern density of the dummy bonding pads 176. In some embodiments, a ratio of the pattern density of the dummy bonding pads 176 to the pattern density of the bonding pads 174 ranges from 1:2.7 to 1:27. For example, the pattern density of the bonding pads 174 in the first region R1 may be approximately 27% while the pattern density of the dummy bonding pads 176 in the second region R2 may be approximately 1% to approximately 10%.

As illustrated in FIG. 2C, a width $W_{174}$ of each bonding pad 174 is substantially the same as a width $W_{176}$ of each dummy bonding pads 176. In some embodiments, the width $W_{174}$ of the bonding pads 174 may range between 2.5 μm and 3.5 μm. Similarly, the width $W_{176}$ of the dummy bonding pads 176 may also range between 2.5 μm and 3.5 μm. On the other hand, a pitch $P_{174}$ between two adjacent bonding pads 174 is different from a pitch $P_{176}$ between two adjacent dummy bonding pads 176. Similarly, a spacing $S_{174}$ between two adjacent bonding pads 174 is also different from a spacing $S_{176}$ between two adjacent dummy bonding pads 176. In some embodiments, the pitch $P_{174}$ between two adjacent bonding pads 174 ranges between 6 μm and 9 μm. On the other hand, the pitch $P_{176}$ between two adjacent dummy bonding pads 176 ranges between 8 μm and 12.6 μm. That is, the pitch $P_{176}$ between two adjacent dummy bonding pads 176 is greater the pitch $P_{174}$ between two adjacent bonding pads 174. For example, the pitch $P_{176}$ between two adjacent dummy bonding pads 176 is approximately twice the pitch $P_{174}$ between two adjacent bonding pads 174. In some embodiments, the spacing $P_{174}$ between two adjacent bonding pads 174 ranges between 2.5 μm and 6.5 μm. On the other hand, the spacing $S_{176}$ between two adjacent dummy bonding pads 176 ranges between 4.5 μm and 15.5 μm. That is, the spacing $S_{174}$ between two adjacent bonding pads 174 is smaller than the spacing $S_{176}$ between two adjacent dummy bonding pads 176. As illustrated in FIG. 2C, the dummy bonding pads 176 are arranged in a staggered manner. That is, the dummy bonding pads 176 in a certain row are not aligned with the dummy bonding pads 176 in the immediately adjacent row. As illustrated in FIG. 2C, by arranging the patterns in a staggered manner and by varying the pitch and the spacing between two adjacent patterns, the difference in pattern densities in the first region R1 and the second region R2 may be achieved.

Figure 1D:
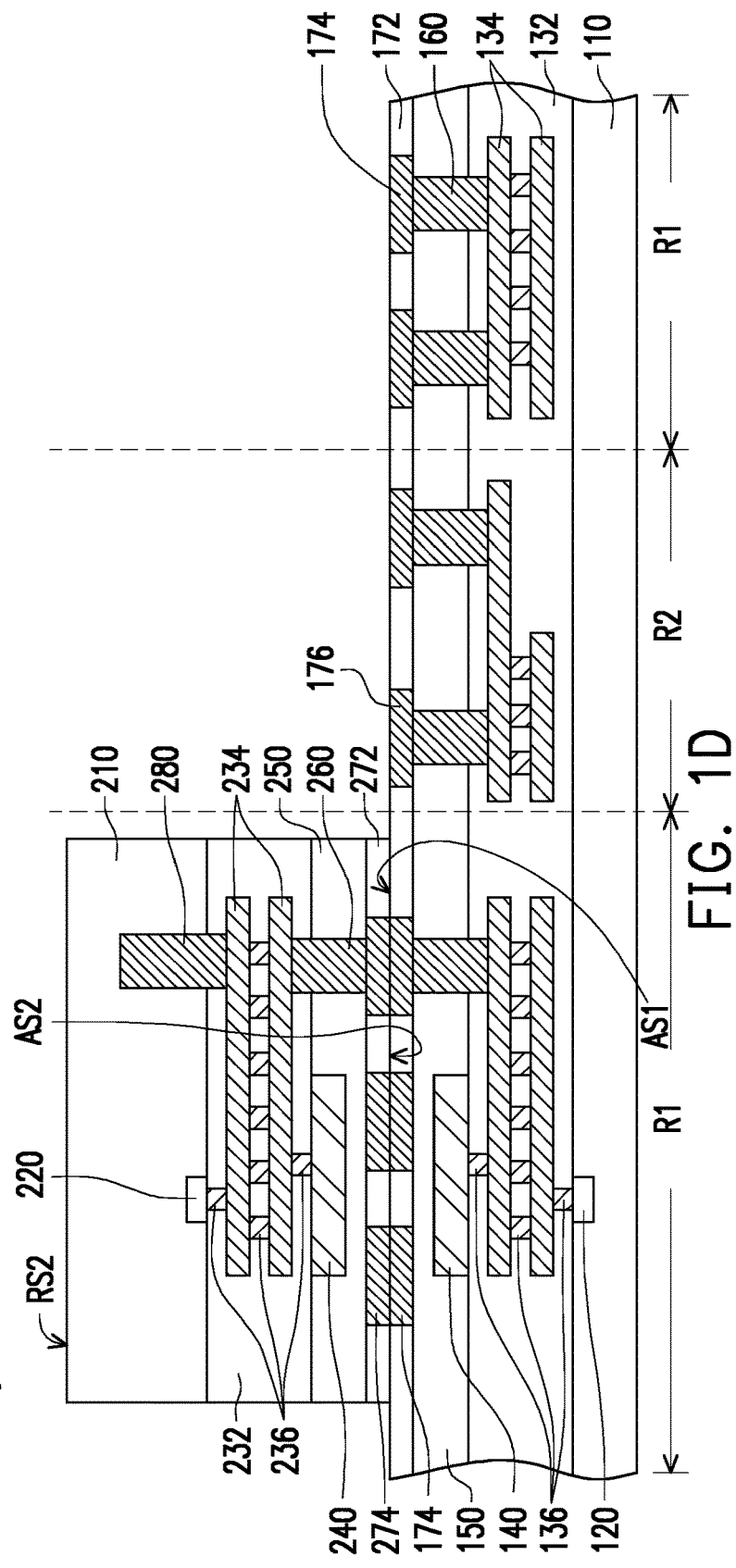

Referring to FIG. 1D, a die 200 is provided. In some embodiments, the die 200 includes a semiconductor substrate 210, a device 220, an interconnection structure 230, a conductive pad 240, a passivation layer 250, a bonding via 260, a bonding layer 270, and a through semiconductor via (TSV) 280. In some embodiments, the device 220 is formed in the semiconductor substrate 210. The semiconductor substrate 210 and the device 220 in die 200 are respectively similar to the semiconductor substrate 110 and the device 110 in the wafer substrate WS, so the detailed descriptions thereof are omitted herein.

As illustrated in FIG. 1D, the interconnection structure 230 is disposed on the semiconductor substrate 110. In some embodiments, the interconnection structure 230 is electrically connected to the device 220 formed in the semiconductor substrate 210. In some embodiments, the interconnection structure 230 includes a dielectric layer 232, a plurality of conductive patterns 234, and a plurality of conductive vias 236. The dielectric layer 232, the conductive patterns 234, and the conductive vias 236 of the interconnection structure 230 are respectively similar to the dielectric layer 132, the conductive patterns 134, and the conductive vias 136 of the interconnection structure 130, so the detailed descriptions thereof are omitted herein.

In some embodiments, the conductive pad 240, the passivation layer 250, and the bonding via 260 are formed over the interconnection structure 230. In some embodiments, the conductive pad 240, the passivation layer 250, and the bonding via 260 of the die 200 are respectively similar to the conductive pad 140, the passivation layer 150, and the bonding via 160 of the wafer substrate WS, so the detailed descriptions thereof are omitted herein. In some embodiments, the conductive pad 240 is electrically connected to the interconnection structure 230. In some embodiments, the bonding via 260 is formed to penetrate through the passivation layer 250 and at least part of the dielectric layer 232 of the interconnection structure 230 to establish electrical connection with the conductive patterns 234 of the interconnection structures 230. That is, a portion of the bonding via 260 is embedded in the passivation layer 250 and another portion of the bonding via 260 is embedded in the dielectric layer 232 of the interconnection structure 230.

As illustrated in FIG. 1D, the bonding layer 270 is formed over the passivation layer 250 and the bonding via 260. In some embodiments, the bonding layer 270 includes a dielectric layer 272 and a plurality of bonding pads 274. The dielectric layer 272 and the bonding pads 274 of the bonding layer 270 are respectively similar to the dielectric layer 172 and the bonding pads 174 of the bonding layer 170, so the detailed descriptions thereof are omitted herein. In some embodiments, the bonding pads 274 are electrically connected to the bonding vias 260. That is, the bonding via 260 electrically connects the interconnection structure 230 with the bonding pads 274.

In some embodiments, the TSV 280 is embedded in the semiconductor substrate 210 and the dielectric layer 232 of the interconnection structure 230. That is, the TSV 280 extends from the semiconductor substrate 210 to the interconnection structure 230. For example, a portion of the TSV 280 is embedded in the semiconductor substrate 210 while another portion of the TSV 280 is embedded in the dielectric layer 232 of the interconnection structure 230. In some embodiments, the TSV 280 is directly in contact with the conductive pattern 234 to render electrical connection with the interconnection structure 230. For simplicity, one TSV 280 is shown in FIG. 1D. However, it should be understood that the die 200 may include more than one TSVs.

In some embodiments, the die 200 may be capable of performing storage functions. For example, the die 200 may be Dynamic Random Access Memory (DRAM), Resistive Random Access Memory (RRAM), Static Random Access Memory (SRAM), or the like. However, the disclosure is not limited thereto. In some alternative embodiments, the die 200 may be Central Process Unit (CPU) dies, Graphic Process Unit (GPU) dies, Field-Programmable Gate Array (FPGA), or the like.

As illustrated in FIG. 1D, bottom surfaces of the bonding pads 274 and a bottom surface of the dielectric layer 272 may be collectively referred to as an active surface AS2 of the die 200. On the other hand, a surface of the die 200 opposite to the active surface AS2 may be referred to as a rear surface RS2 of the die 200. As shown in FIG. 1D, the bottom surfaces of the bonding pad 274 and the bottom surface of the dielectric layer 272 are substantially located at the same level height to provide an appropriate active surface AS2 for hybrid bonding.

As illustrated in FIG. 1D, the die 200 is placed on the wafer substrate WS such that the die 200 is bonded to the wafer substrate WS. For simplicity, one die 200 is shown in FIG. 1D. However, it should be understood that more than one dies may be bonded to the wafer substrate WS. In some embodiments, the die 200 may be bonded to the wafer substrate WS through a hybrid bonding process. In some embodiments, a temperature of the hybrid bonding process ranges from about 150° C. to about 400° C. The hybrid bonding process will be described in detail below.

In some embodiments, the die 200 may be picked-and-placed onto the active surface AS1 of the wafer substrate WS such that the die 200 is electrically connected to the wafer substrate WS. In some embodiments, the die 200 is placed such that the active surface AS2 of the die 200 is in contact with the active surface AS1 of the wafer substrate WS. Meanwhile, the bonding pads 274 of the die 200 are substantially aligned and in direct contact with the corresponding bonding pads 174 of the wafer substrate WS. In some embodiments, to facilitate the hybrid bonding between the die 200 and the wafer substrate WS, surface preparation for bonding surfaces (i.e. the active surface AS1 and the active surface AS2) of the wafer substrate WS and the die 200 may be performed. The surface preparation may include surface cleaning and activation, for example. Surface cleaning may be performed on the active surfaces AS1, AS2 to remove particles on the bonding surface of the dielectric layer 172, the bonding surfaces of the bonding pads 174, the bonding surface of the dielectric layer 272, and the bonding surfaces of the bonding pads 274. In some embodiments, the active surfaces AS1, AS2 may be cleaned by wet cleaning, for example. Not only particles are removed, but also native oxide formed on the bonding surfaces of the bonding pads 174 and the bonding pads 274 may be removed. The native oxide formed on the bonding surfaces of the bonding pads 174 and the bonding pads 274 may be removed by chemicals used in wet cleaning processes, for example.

After cleaning the active surfaces AS1 of the wafer substrate WS and the active surfaces AS2 of the die 200, activation of the bonding surfaces of the dielectric layer 172 and the dielectric layer 272 may be performed for development of high bonding strength. In some embodiments, plasma activation may be performed to treat the bonding surfaces of the dielectric layer 172 and the dielectric layer 272. When the activated bonding surface of the dielectric layer 172 is in contact with the activated bonding surface of the dielectric layer 272, the dielectric layer 172 of the wafer substrate WS and the dielectric layer 272 of the die 200 are pre-bonded.

After pre-bonding the die 200 onto the wafer substrate WS, hybrid bonding of the die 200 and the wafer substrate WS is performed. The hybrid bonding of the die 200 and the wafer substrate WS may include a thermal treatment for dielectric bonding and a thermal annealing for conductor bonding. In some embodiments, the thermal treatment for dielectric bonding is performed to strengthen the bonding between the dielectric layer 172 and the dielectric layer 272. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 174 and the bonding pads 274. For example, the thermal annealing for conductor bonding may be performed at temperature ranging from about 150° C. to about 400° C. After performing the thermal annealing for conductor bonding, the dielectric layer 172 is hybrid bonded to the dielectric layer 272 and the bonding pads 174 are hybrid bonded to the bonding pads 274. For example, the dielectric layer 172 is directly in contact with the dielectric layer 272.

Similarly, the bonding pads 174 are directly in contact with the bonding pads 274. As such, the bonding layer 170 of the wafer substrate WS is hybrid bonded to the bonding layer 270 of the die 200. Although FIG. 1D illustrated that the bonding pads 174 and the bonding pads 274 have sharp corners (the sidewalls are perpendicular to the top/bottom surfaces), the disclosure is not limited thereto. In some alternative embodiments, after the bonding pads 174 are hybrid bonded to the bonding pads 274, corner rounding of the bonding pads may occur. For example, the corners of the bonding pads 174 facing the bonding pads 274 are rounded. Similarly, the corners of the bonding pads 274 facing the bonding pads 174 are also rounded. That is, edges of the top surface of each bonding pad 174 are rounded. Similarly, edges of the bottom surface of each bonding pad 274 are also rounded. Moreover, although FIG. 1D illustrated that the bonding pads 174 and the bonding pads 274 have the same width and sidewalls of the bonding pads 174 are aligned with sidewalls of the bonding pads 274, the disclosure is not limited thereto. In some alternative embodiments, the width of each bonding pad 174 may be smaller than or larger than the width of each bonding pad 274.

As illustrated in FIG. 1D, the die 200 is placed in the first region R1 to cover some of the bonding pads 174. In other words, the dummy bonding pads 176 located in the second region R2 do not involve in the hybrid bonding process. For example, after the hybrid bonding process, the dummy bonding pads 176 located in the second region R2 are still exposed. Similarly, some of the bonding pads 174 located in the first region R1 are also exposed.

In some embodiments, since the wafer substrate WS is in wafer form and the die 200 is in chip form, the hybrid bonding process in FIG. 1D may be referred to as a "chip-on-wafer bonding process." In some embodiments, since the active surface AS1 of the wafer substrate WS are hybrid bonded to the active surface AS2 of the die 200, the bonding between the wafer substrate WS and the die 200 may be considered as face-to-face bonding.

Figure 1E:
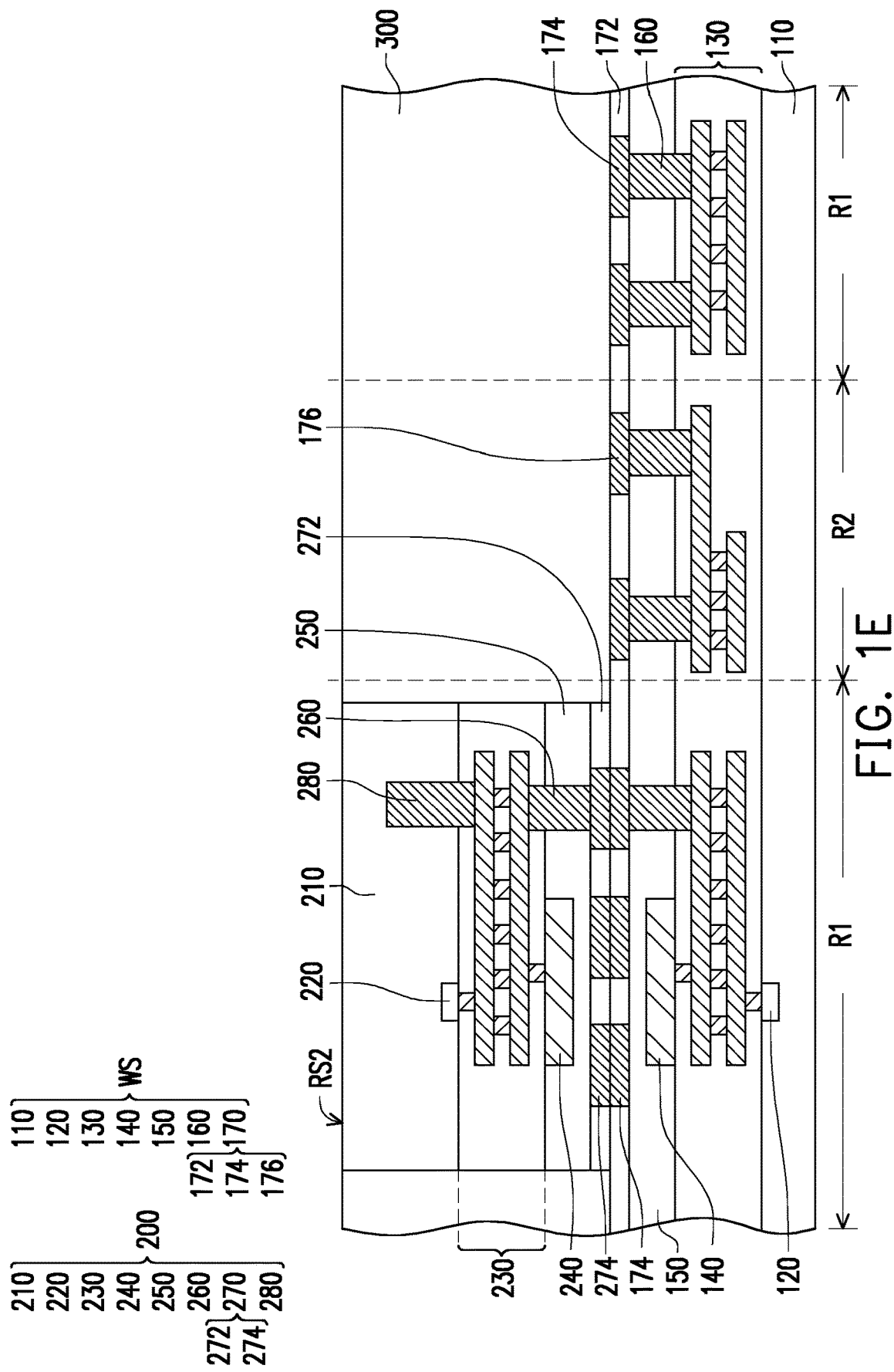

Referring to FIG. 1E, an encapsulant 300 is formed over the wafer substrate WS to laterally encapsulate the die 200. For example, at least a portion of the encapsulant 300 is located in the second region R2. That is, the encapsulant 300 covers and directly in contact with the dummy bonding pads 176 located in the second region R2. Meanwhile, the encapsulant 300 also covers some of the bonding pads 174 located in the first region R1. In some embodiments, a material of the encapsulant 300 includes a molding compound, a polymeric material, such as polyimide, epoxy resin, acrylic resin, phenol resin, BCB, PBO, a combination thereof, or other suitable polymer-based dielectric materials. In some alternative embodiments, the encapsulant 300 may include silicon oxide and/or silicon nitride. In some embodiments, the encapsulant 300 further includes fillers. Alternatively, the encapsulant 300 may be free of fillers. In some embodiments, the encapsulant 300 may be formed by the following steps. First, an encapsulation material (not shown) is formed over the bonding layer 170 to encapsulate the die 200. At this stage, the semiconductor substrate 210 of the die 200 is not revealed and is well protected by the insulating material. For example, the rear surface RS2 of the die 200 is not revealed. In some embodiments, the encapsulation material may be formed by a molding process (such as a compression molding process), a spin-coating process, a CVD process, a PECVD process, an atomic layer deposition (ALD) process, or the like. After the encapsulation material is formed, the encapsulation material is thinned until the rear surface RS2 of the die 200 is exposed, so as to form the encapsulant 300 aside the die 200. In some embodiments, the encapsulation material may be thinned or planarized through a grinding process, such as a mechanical grinding process, a chemical mechanical polishing (CMP) process, or the like. As illustrated in FIG. 1E, the rear surface RS2 of the die 200 is substantially coplanar with a top surface of the encapsulant 300. In some embodiments, the encapsulant 300 may be referred to as "gap fill oxide."

Figure 1F:
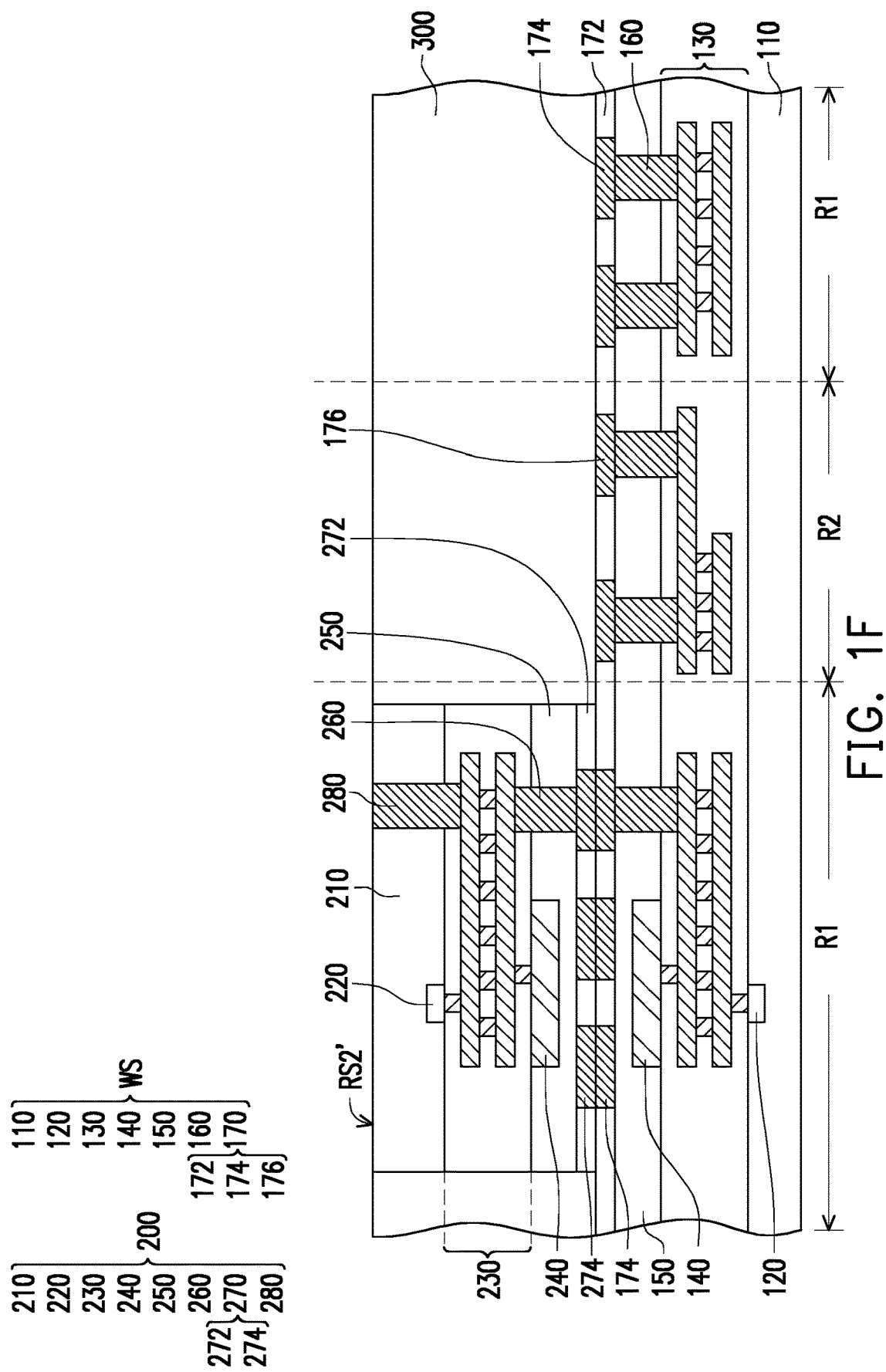

Referring to FIG. 1E and FIG. 1F, the die 200 and the encapsulant 300 are further thinned until the TSV 280 is exposed. That is, the die 200 is thinned from the rear surface RS2. In some embodiments, the die 200 and the encapsulant 300 may be thinned or planarized through a grinding process, such as a mechanical grinding process, a CMP process, or the like. In some embodiments, after the TSV 280 is exposed, the die 200 and the encapsulant 300 may be further thinned to reduce the overall thickness of the die 200. After the thinning process, a rear surface RS2' of the die 200 is substantially coplanar with a top surface of the encapsulant 300. As illustrated in FIG. 1F, after the thinning process, the TSV 280 penetrates through the semiconductor substrate 210 of the die 200.

Figure 1G:
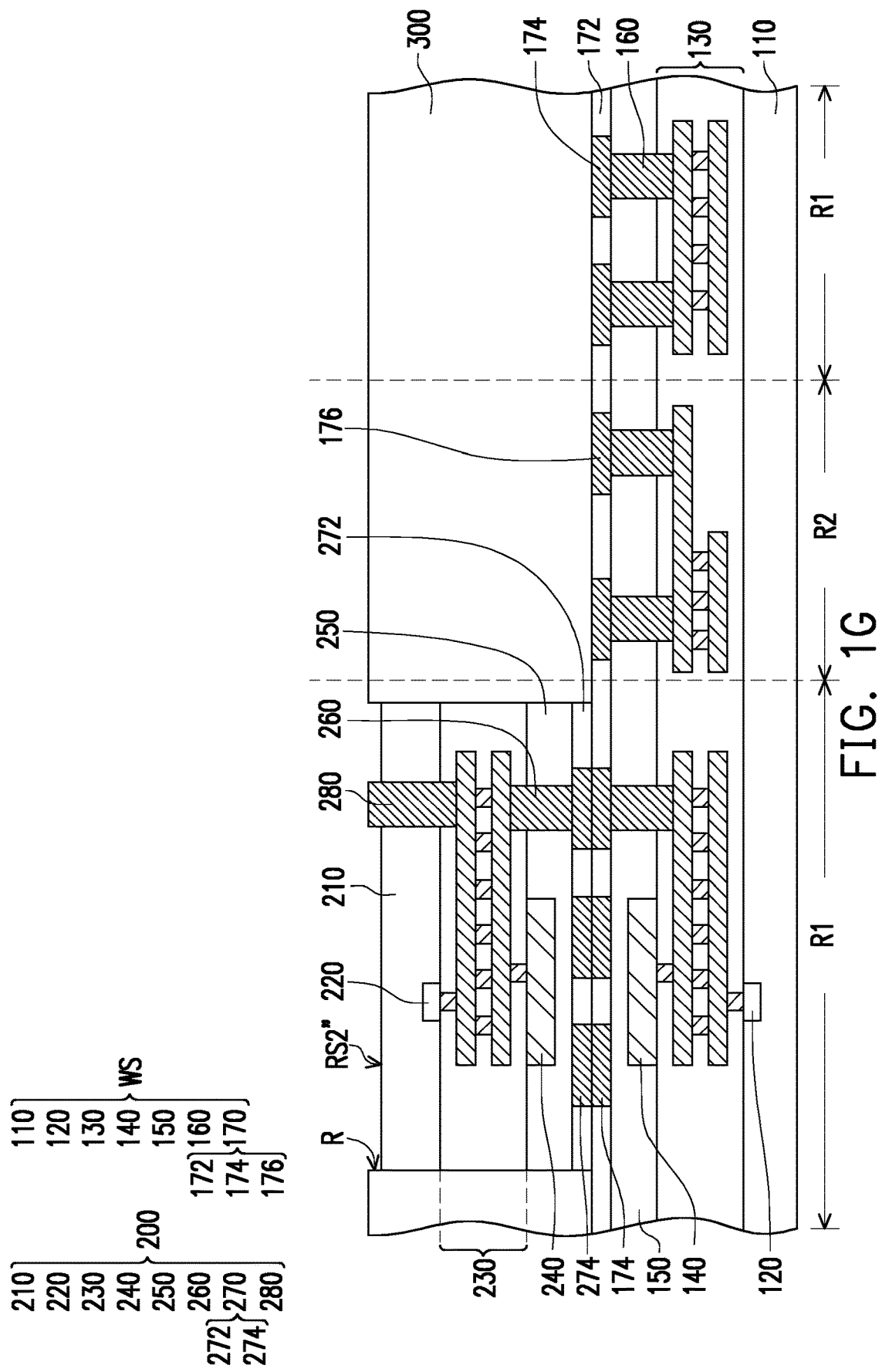

Referring to FIG. 1G, a portion of the die 200 is removed to form a recess R. For example, a portion of the semiconductor substrate 210 of the die 200 is removed to form the recess R. As illustrated in FIG. 1G, the TSV 280 is partially located in the recess R. In some embodiments, at least a portion of the TSV 280 protrudes from the semiconductor substrate 210 of the die 200. That is, a top surface of the TSV 280 and the top surface of the encapsulant 300 are located at a level height higher than a rear surface RS2" of the die 200. In some embodiments, the semiconductor substrate 210 may be partially removed through an etching process. The etching process includes, for example, an isotropic etching process and/or an anisotropic etching process. For example, the semiconductor substrate 210 may be partially removed through a wet etching process, a drying etching process, or a combination thereof.

Figure 1H:
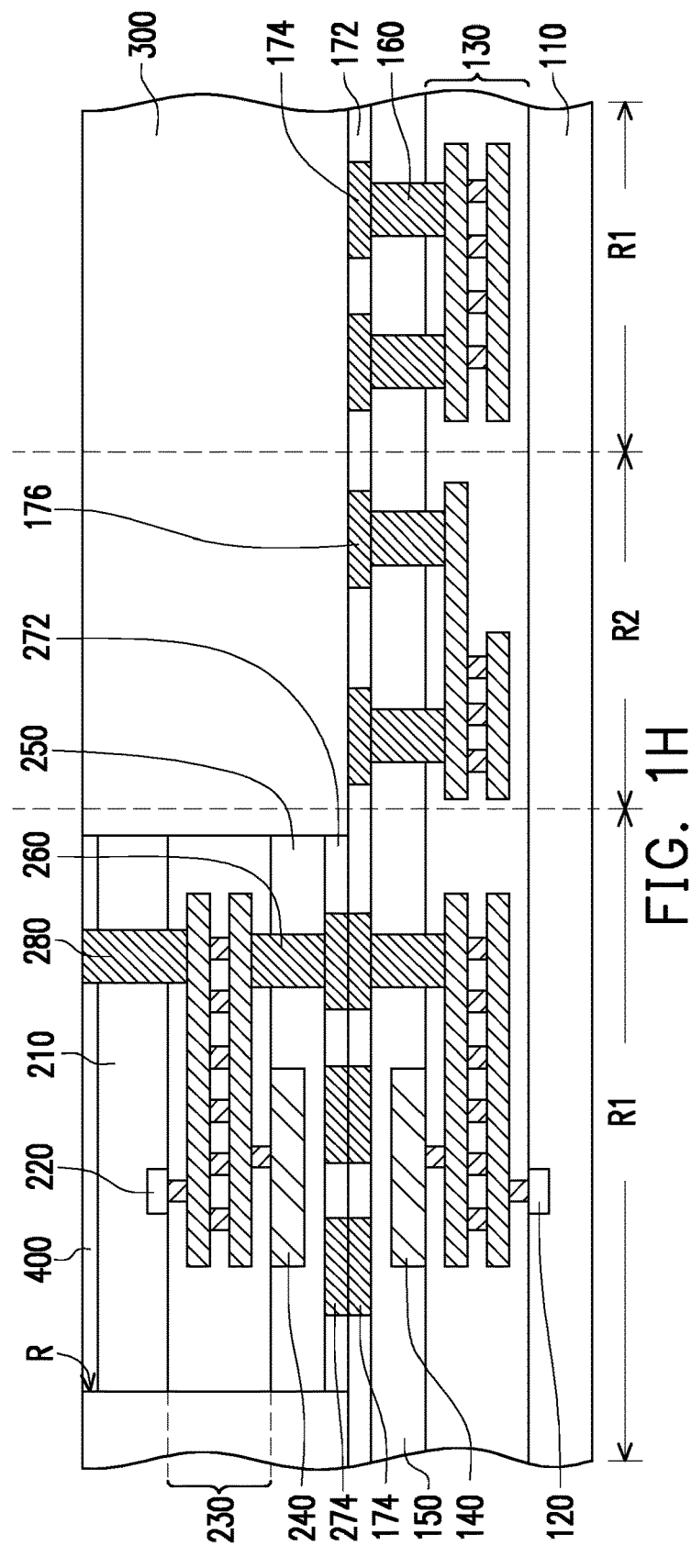

Referring to FIG. 1G and FIG. 1H, a protection layer 400 is formed to fill the recess R. In some embodiments, the protection layer 400 includes a molding compound, a molding underfill, or the like. Alternatively, the protection layer 400 may be made of a polymeric material, such as polyimide, epoxy resin, acrylic resin, phenol resin, BCB, PBO, or other suitable polymer-based dielectric materials. In some embodiments, the protection layer 400 may include fillers. Alternatively, the protection layer 400 may be free of fillers. As illustrated in FIG. 1H, the protruding portion of the TSV 280 is laterally encapsulated by the protection layer 400. In some embodiments, the protection layer 400 may be formed by the following steps. First, a protection material layer (not shown) is formed in the recess R and over the encapsulant 300. Subsequently, a grinding or thinning process is performed on the protection material layer until the TSV 280 is revealed. The thinning process includes, for example, a mechanical grinding process, a CMP process, or the like. As illustrated in FIG. 1H, the encapsulant 300 laterally encapsulates the protection layer 400.

Figure 1I:
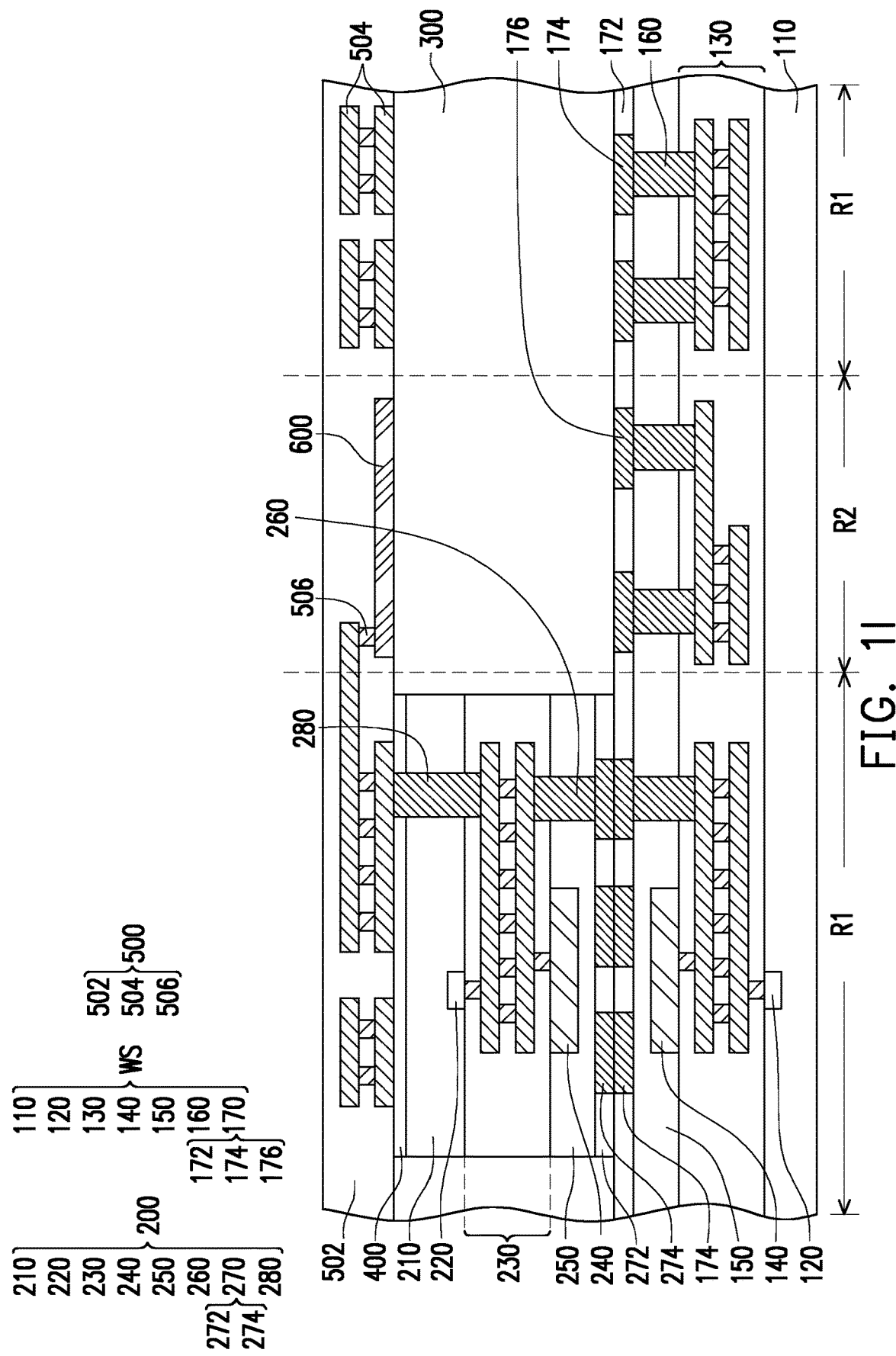

Referring to FIG. 1I, a redistribution structure 500 and an inductor 600 are formed over the die 200, the encapsulant 300, and the protection layer 400. In some embodiments, the redistribution structure 500 includes a dielectric layer 502, a plurality of conductive patterns 504, and a plurality of conductive vias 506. For simplicity, the dielectric layer 502 is illustrated as a single dielectric layer and the conductive patterns 504 are illustrated as embedded in the dielectric layer 502. Nevertheless, from the perspective of the manufacturing process, the dielectric layer 502 is constituted by at least two dielectric layers, and the conductive patterns 504 are sandwiched between two adjacent dielectric layers. In some embodiments, the conductive patterns 504 located at different level heights are connected to each other through the conductive vias 506. In other words, the conductive patterns 504 are electrically connected to each other through the conductive vias 506. In some embodiments, the bottommost conductive pattern 504 is directly in contact with the TSV 280 of the die 200. In other words, the redistribution structure 500 is electrically connected to the die 200.

In some embodiments, the material of the dielectric layer 502 includes polyimide, epoxy resin, acrylic resin, phenol resin, BCB, PBO, or any other suitable polymer-based dielectric material. The dielectric layer 502, for example, may be formed by suitable fabrication techniques such as spin-on coating, CVD, PECVD, or the like. In some embodiments, a material of the conductive patterns 504 and the conductive vias 506 includes aluminum, titanium, copper, nickel, tungsten, or alloys thereof. The conductive patterns 504 and the conductive vias 506 may be formed by, for example, electroplating, deposition, and/or photolithography and etching. In some embodiments, the conductive patterns 504 and the underlying conductive vias 506 may be formed simultaneously. It should be noted that the number of the dielectric layers 502, the number of the conductive patterns 504, and the number of the conductive vias 506 illustrated in FIG. 1I are merely for illustrative purposes, and the disclosure is not limited thereto. In some alternative embodiments, fewer or more layers of the dielectric layers 502, the conductive patterns 504, or the conductive vias 506 may be formed depending on the circuit design.

As illustrated in FIG. 1I, the inductor 600 is embedded in the redistribution structure 500. For example, the inductor 600 is embedded in the dielectric layer 502 of the redistribution structure 500. In some embodiments, the inductor 600 is electrically connected to the conductive patterns 504 through the conductive via 506. In some embodiments, a material of the inductor 600 includes aluminum, titanium, copper, nickel, tungsten, or alloys thereof. In some embodiments, the material of the inductor 600 may be the same as the conductive patterns 504 of the redistribution structure 500. Alternatively, the material of the inductor 600 may be different from the conductive patterns 504 of the redistribution structure 500. In some embodiments, the inductor 600 and the bottommost conductive patterns 504 of the redistribution structure 500 are located at the same level height. For example, the inductor 600 and the bottommost conductive patterns 504 may be simultaneously formed through the same process. In some embodiments, the inductor 600 is directly in contact with the encapsulant 300. The configuration of the bonding pads 174, the dummy bonding pads 176, the die 200, and the inductor 600 will be described below in conjunction with FIG. 3.

Figure 3:
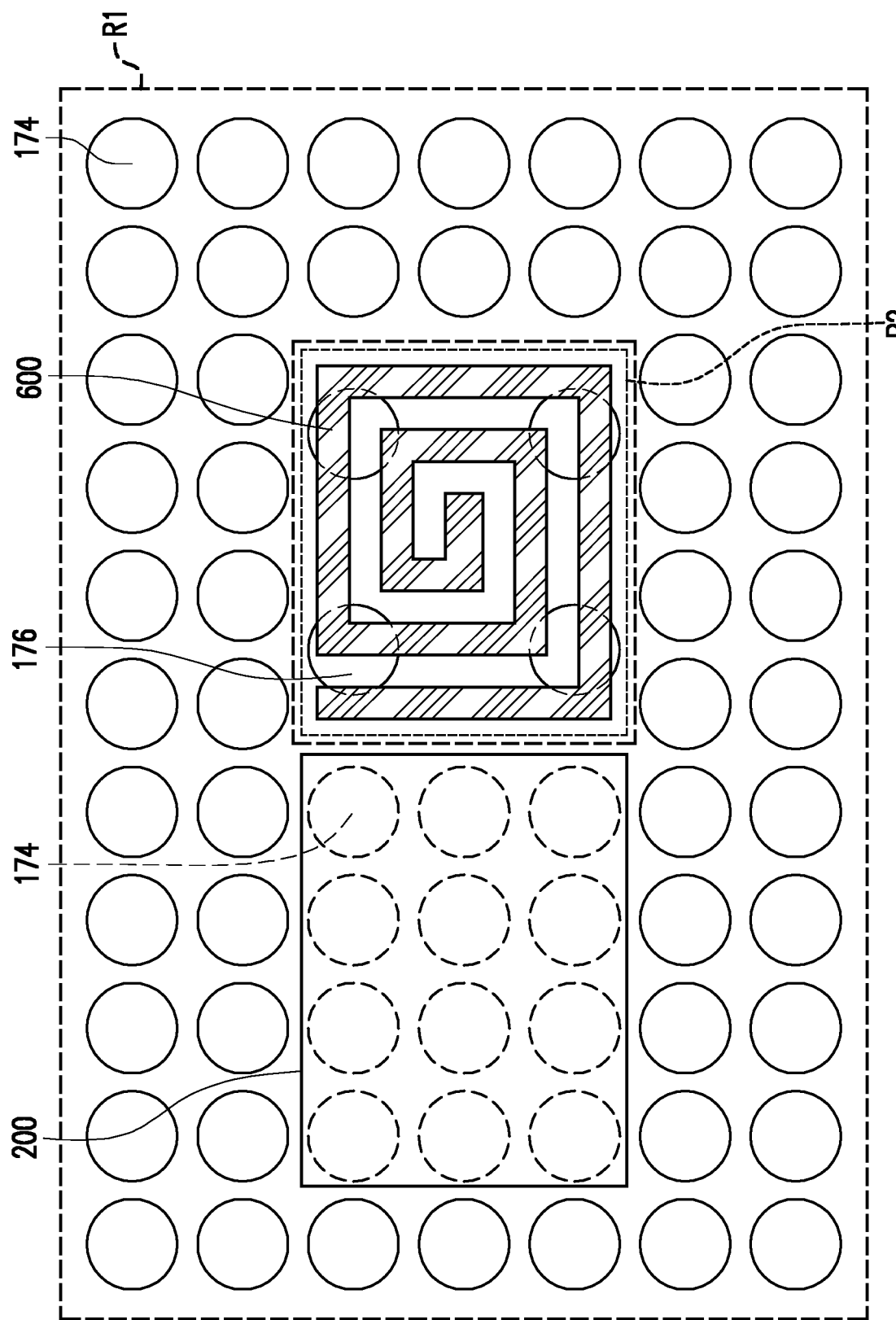
FIG. 3 is a schematic top view of FIG. 1I.

FIG. 3 is a schematic top view of FIG. 1I. For simplicity, elements other than the bonding pads 174, the dummy bonding pads 176, the die 200, and the inductor 600 are omitted in FIG. 3. Referring to FIG. 1I and FIG. 3, the first region R1 surrounds the second region R2. In some embodiments, the bonding pads 174 are located in the first region R1 and the dummy bonding pads 176 are located in the second region R2. In some embodiments, the die 200 is located in the first region R1 and covers some of the bonding pads 174. On the other hand, the inductor 600 is located in the second region R2 and covers/overlaps with the dummy bonding pads 176. That is, the inductor 600 is located directly above the dummy bonding pads 176. As mentioned above, the pattern density of the bonding pads 174 in the first region R1 is greater than the pattern density of the dummy bonding pads 176 in the second region R2. Moreover, the metal density of the second region R2 is smaller than the metal density of the first region R1. Since the inductor 600 is located in the second region R2, less metal is overlapped with the inductor 600. As such, RLC performance degradation derived from overlapping of an inductor with large area of metal may be alleviated, thereby enhancing the quality factor of the inductor. As illustrated in FIG. 3, the inductor 600 takes the form of rectangular coil. However, the disclosure is not limited thereto. In some alternative embodiments, the inductor 600 may take the form of circular coil, triangular coil, polygonal coil, or the like.

It should be noted that although the configuration of the bonding pads 174 and the dummy bonding pads 176 in FIG. 3 is similar to that of FIG. 2A, the disclosure is not limited thereto. The bonding pads 174 and the dummy bonding pads 176 in FIG. 3 may also adopt the configurations as shown in FIG. 2B or FIG. 2C.

Figure 1J:
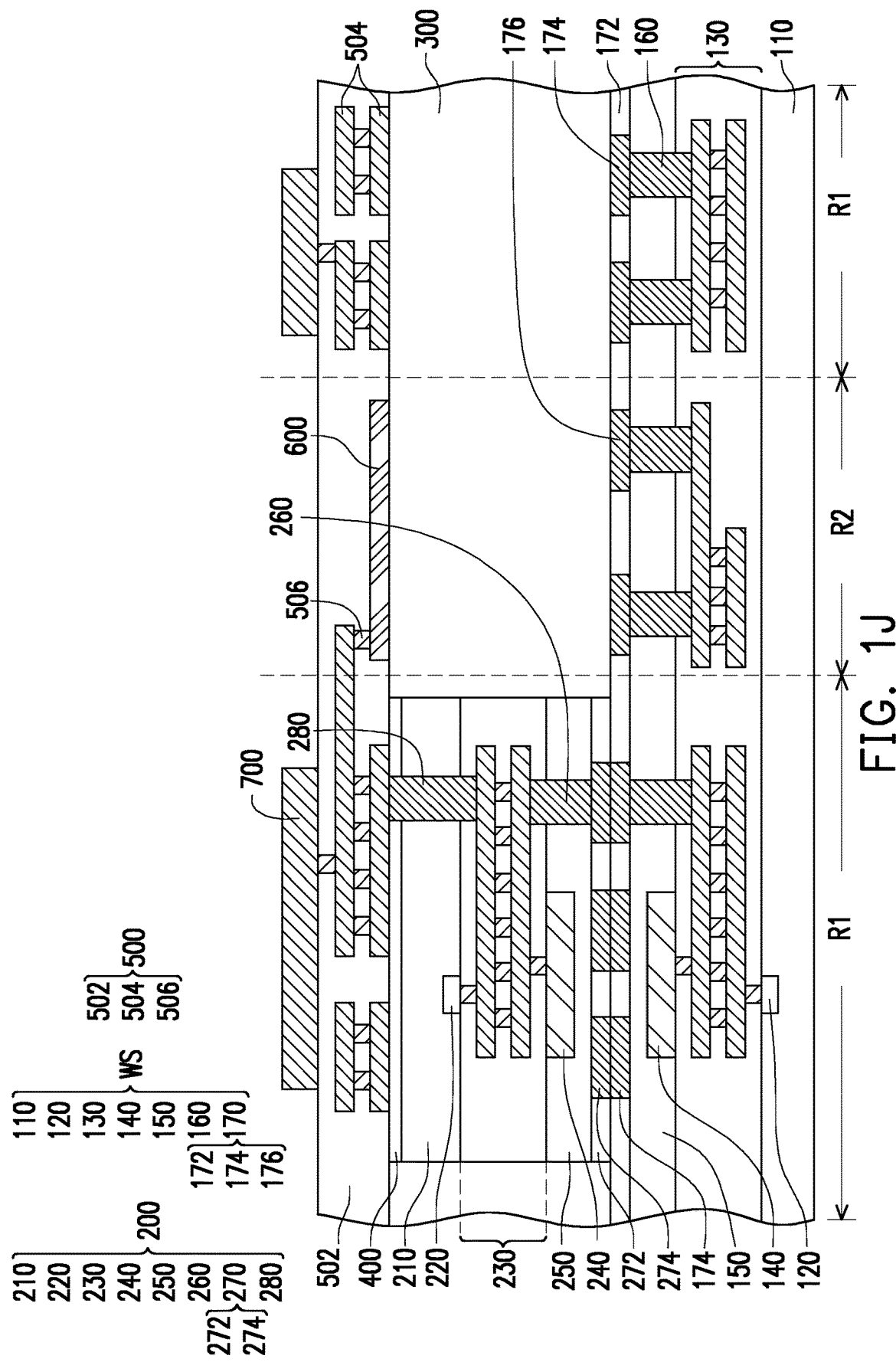

Referring to FIG. 1J, a plurality of bump pads 700 is formed over the redistribution structure 500. In some embodiments, a material of the bump pads 700 includes aluminum, titanium, copper, nickel, tungsten, or alloys thereof. In some embodiments, the material of the bump pads 700 are different from the conductive patterns 504 of the redistribution structure 500. For example, the conductive patterns 504 of the redistribution structure 500 may be made of copper while the bump pads 700 may be made of aluminum. However, the disclosure is not limited thereto. In some alternative embodiments, the material of the bump pads 700 may be the same as the material of the conductive patterns 504 of the redistribution structure 500. In some embodiments, the bump pads 700 may be formed by, for example, electroplating, deposition, and/or photolithography and etching. In some embodiments, the bump pads 700 are electrically connected to the conductive patterns 504 of the redistribution structure 500.

Figure 1K:
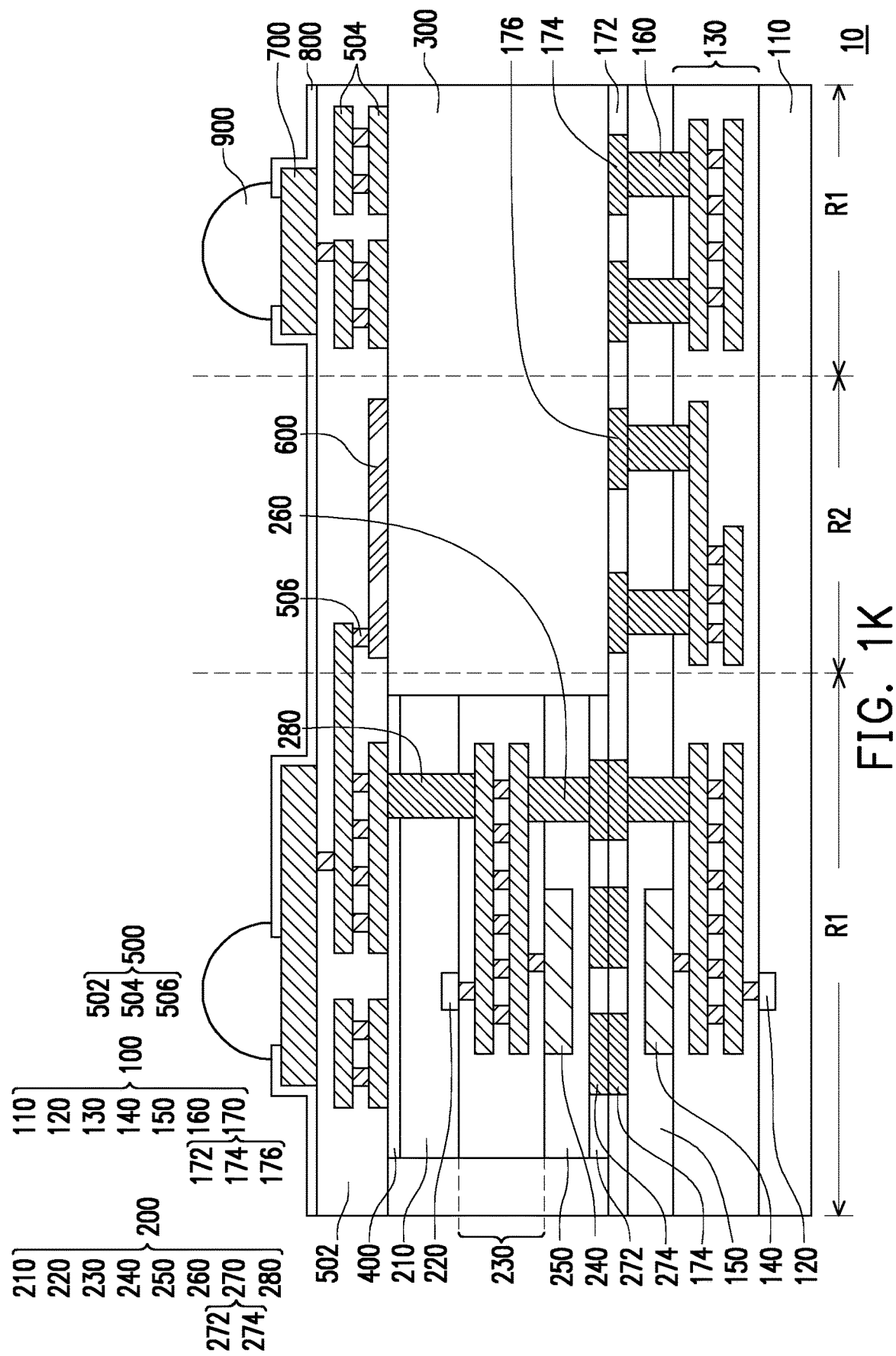

Referring to FIG. 1K, a passivation layer 800 and a plurality of conductive terminals 900 are sequentially formed over the redistribution structure 500 and the bump pads 700. In some embodiments, a material of the passivation layer 800 includes oxides, such as silicon oxide or the like. Alternatively, the passivation layer 800 may include polyimide, epoxy resin, acrylic resin, phenol resin, BCB, PBO, or any other suitable polymer-based dielectric material. The passivation layer 800, for example, may be formed by suitable fabrication techniques, such as spin-on coating, CVD, PECVD, or the like. In some embodiments, the passivation layer 800 is formed to expose at least a portion of the bump pads 700.

As illustrated in FIG. 1K, the conductive terminals 900 are formed on the exposed portion of the bump pads 700. In some embodiments, a plurality of under-bump metallurgy (UBM) patterns (not shown) may be optionally provided between the conductive terminal 900 and the bump pads 700. In some embodiments, the conductive terminals 900 are attached to the bump pads 700/the UBM patterns through a solder flux. In some embodiments, the conductive terminals 900 are, for example, solder balls, ball grid array (BGA) balls, or controlled collapse chip connection (C4) bumps. In some embodiments, the conductive terminals 900 are made of a conductive material with low resistivity, such as Sn, Pb, Ag, Cu, Ni, Bi, or an alloy thereof.

After the conductive terminals 900 are formed, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the wafer substrate WS is divided into a plurality of dies 100. That is, each die 100 includes the semiconductor substrate 110, the device 120, the interconnection structure 130, the conductive pad 140, the passivation layer 150, the bonding vias 160, and the bonding layer 170.

As illustrated in FIG. 1K, the package 10 has the first region R1 and the second region R2. The first region R1 surrounds the second region R2. The die 200 is stacked on and bonded to the die 100. In other words, multiple dies 100 and 200 are integrated into a single package 10. As such, the package 10 may be referred to as a "system on integrated circuit (SOIC) package." In some embodiments, the die 100 has a bonding layer 170, and the bonding layer 170 includes bonding pads 174 located in the first region R1 and dummy bonding pads 176 located in the second region R2. The pattern density of the dummy bonding pads 176 is smaller than the pattern density of the bonding pads 174. The encapsulant 300 is aside the die 200 and laterally encapsulates the die 200. In some embodiments, at least a portion of the encapsulant 300 is located in the second region R2. In some embodiments, the inductor 600 is located in the second region R2. That is, the inductor 600 is directly above the dummy bonding pads 176. Since the dummy bonding pads 176 has low pattern density, the inductor 600 is subjected to less RLC performance degradation, and the quality factor of the inductor 600 may be enhanced.

Figure 4:
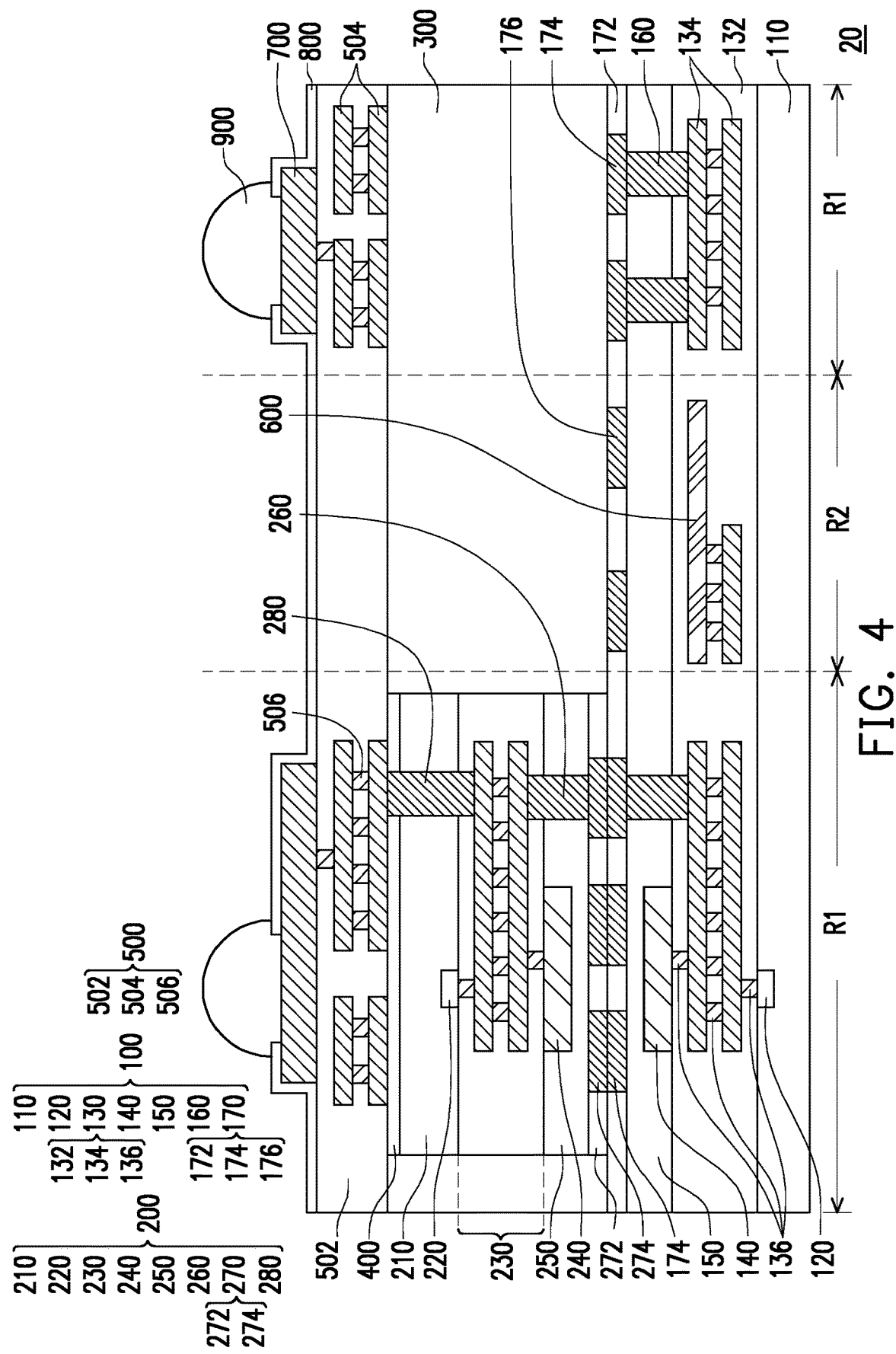
FIG. 4 is a schematic cross-sectional view illustrating a package in accordance with some alternative embodiments of the disclosure.

FIG. 4 is a schematic cross-sectional view illustrating a package 20 in accordance with some alternative embodiments of the disclosure. Referring to FIG. 4, the package 20 in FIG. 4 is similar to the package 10 in FIG. 1K, so similar elements are denoted by the same reference numeral and the detailed descriptions thereof are omitted herein. As illustrated in FIG. 4, the inductor 600 is embedded in the die 100. For example, the inductor 600 is embedded in the interconnection structure 130 of the die 100. In some embodiments, the inductor 600 and the topmost conductive patterns 134 of the interconnection structure 130 are located at the same level height. For example, the inductor 600 and the topmost conductive patterns 134 may be simultaneously formed through the same process. In some embodiments, the inductor 600 is electrically connected to the conductive patterns 134 of the interconnection structure 130. In some embodiments, the inductor 600 is isolated from the dummy bonding pads 176. For example, the inductor 600 is electrically isolated from the dummy bonding pads 176. In some embodiments, the inductor 600 is located in the second region R2 of the package 20 and covers/overlaps with the dummy bonding pads 176. That is, the inductor 600 is located directly below the dummy bonding pads 176. As mentioned above, the pattern density of the bonding pads 174 in the first region R1 is greater than the pattern density of the dummy bonding pads 176 in the second region R2. Moreover, the metal density of the second region R2 is smaller than the metal density of the first region R1. Since the inductor 600 is located in the second region R2, less metal is overlapped with the inductor 600. As such, RLC performance degradation derived from overlapping of an inductor with large area of metal may be alleviated, thereby enhancing the quality factor of the inductor.

It should be noted that the configuration of the bonding pads 174 and the dummy bonding pads 176 illustrated in FIG. 2A, FIG. 2B, and FIG. 2C are also applicable to the package 20 shown in FIG. 4.

In accordance with some embodiments of the disclosure, a package has a first region and a second region. The package includes a first die, a second die, an encapsulant, and an inductor. The second die is stacked on and bonded to the first die. The encapsulant is aside the second die. At least a portion of the encapsulant is located in the second region. The inductor is located in the second region. A metal density in the first region is greater than a metal density in the second region.

In accordance with some alternative embodiments of the disclosure, a package includes a first die, a second die, an encapsulant, and an inductor. The first die includes bonding pads and dummy bonding pads. A pattern density of the bonding pads is greater than a pattern density of the dummy bonding pads. The second die is bonded to the first die. The second die covers the bonding pads. The encapsulant is disposed on the first die. The encapsulant laterally encapsulates the second die and covers the dummy bonding pads. The inductor is over the dummy bonding pads.

In accordance with some embodiments of the disclosure, a manufacturing method of a package includes at least the following steps. A wafer substrate having a first region and a second region is provided. The wafer substrate is provided by at least the following steps. First bonding pads having a first pattern density are formed in the first region. Dummy bonding pads having a second pattern density are formed in the second region. The first pattern density is greater than the second pattern density. Subsequently, a die is placed on the first region of the wafer substrate. The die includes second bonding pads hybrid bonded to the first bonding pads. The die is encapsulated by an encapsulant. An inductor is formed over the second region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package having a first region and a second region surrounded by the first region, comprising:
   a first die, extending from the first region to the second region;
   a second die bonded to the first die, wherein the second die is located within a span of the first die;
   an encapsulant aside the second die, wherein at least a portion of the encapsulant is located in the second region; and
   an inductor located in the second region and laterally having an offset from the second die, wherein a metal density in the first region is greater than a metal density in the second region.

2. The package of claim 1, wherein the first die comprises:
   a semiconductor substrate;
   an interconnection structure over the semiconductor substrate;
   a passivation layer over the interconnection structure;
   a bonding layer over the passivation layer, wherein the bonding layer comprises bonding pads located in the first region and dummy bonding pads located in the second region, and a pattern density of the bonding pads is greater than a pattern density of the dummy bonding pads; and
   bonding vias penetrating through the passivation layer, wherein the bonding vias electrically connect the interconnection structure and the bonding pads.

3. The package of claim 2, wherein the inductor is embedded in the interconnection structure.

4. The package of claim 2, wherein the dummy bonding pads are electrically floating.

5. The package of claim 2, wherein a ratio of the pattern density of the dummy bonding pads to the pattern density of the bonding pads ranges from 1:2.7 to 1:27.

6. The package of claim 2, wherein a spacing between two adjacent bonding pads is smaller than a spacing between two adjacent dummy bonding pads.

7. The package of claim 2, wherein a width of each bonding pad is greater than a width of each dummy bonding pad.

8. The package of claim 1, further comprising a redistribution structure over the second die and the encapsulant, wherein the inductor is embedded in the redistribution structure.

9. A package, comprising:
   a first die, comprising bonding pads and dummy bonding pads, wherein the dummy bonding pads are surrounded by the bonding pads, and a pattern density of the bonding pads is greater than a pattern density of the dummy bonding pads;
   a second die bonded to the first die to cover a first portion of the bonding pads;
   an encapsulant laterally encapsulating the second die, wherein the encapsulant is directly in contact with the dummy bonding pads and a second portion of the bonding pads; and
   an inductor over the dummy bonding pads.

10. The package of claim 9, wherein the dummy bonding pads are electrically floating.

11. The package of claim 9, wherein the inductor is embedded in the first die.

12. The package of claim 9, further comprising a redistribution structure over the second die and the encapsulant, wherein the inductor is embedded in the redistribution structure.

13. The package of claim 9, wherein the encapsulant is further in direct contact with the inductor.

14. The package of claim 9, wherein a spacing between two adjacent bonding pads is smaller than a spacing between two adjacent dummy bonding pads.

15. The package of claim 9, wherein a width of each bonding pad is greater than a width of each dummy bonding pad.

16. A manufacturing method of a package, comprising:
   providing a wafer substrate having a first region and a second region surrounded by the first region, comprising:
   forming first bonding pads having a first pattern density in the first region; and
   forming dummy bonding pads having a second pattern density in the second region, wherein the first pattern density is greater than the second pattern density, and the first bonding pads and the dummy bonding pads are located at a same level height;

placing a die on the first region of the wafer substrate, wherein the die comprises second bonding pads;

bonding the second bonding pads of the die to a portion of the first bonding pads of the wafer substrate;

laterally encapsulating the die by an encapsulant; and forming an inductor over the second region.

17. The method of claim 16, wherein at least a portion of the encapsulant is formed to be located over the second region.

18. The method of claim 17, wherein the inductor is formed to be in direct contact with the portion of the encapsulant located over the second region.

19. The method of claim 16, further comprising:

forming a redistribution structure over the die and the encapsulant, wherein the inductor is formed in the redistribution structure; and forming conductive terminals over the redistribution structure.

20. The method of claim 16, wherein the dummy bonding pads are formed to be electrically floating.

* * * * *